United States Patent
Izuta et al.

(10) Patent No.: US 7,238,295 B2
(45) Date of Patent: Jul. 3, 2007

(54) REGENERATION PROCESS OF ETCHING SOLUTION, ETCHING PROCESS, AND ETCHING SYSTEM

(75) Inventors: Nobuhiko Izuta, Tokyo (JP); Mitsugu Murata, Tokyo (JP)

(73) Assignee: m·FSI Ltd., Tokyo (JP)

( * ) Notice: Subject to any disclaimer, the term of this patent is extended or adjusted under 35 U.S.C. 154(b) by 140 days.

(21) Appl. No.: 10/661,662

(22) Filed: Sep. 15, 2003

(65) Prior Publication Data

US 2004/0200806 A1    Oct. 14, 2004

(30) Foreign Application Priority Data

Sep. 17, 2002    (JP)    ............... 2002-269405

(51) Int. Cl.
*C23F 1/00* (2006.01)
*H01L 21/302* (2006.01)

(52) U.S. Cl. ............... 216/93; 216/83; 216/96; 216/99; 438/745; 438/757

(58) Field of Classification Search ............ 216/83, 216/93, 96, 99; 438/745, 757
See application file for complete search history.

(56) References Cited

U.S. PATENT DOCUMENTS 4,980,017 A * 12/1990 Kaji et al. ............ 216/93
5,470,421 A 11/1995 Nakada et al.
6,001,215 A * 12/1999 Ban ............... 156/345.15
6,159,865 A * 12/2000 Kezuka et al. ............ 438/745
6,207,068 B1 * 3/2001 Glick et al. ............... 216/93
6,255,123 B1 * 7/2001 Reis ............... 438/8
6,399,517 B2 * 6/2002 Yokomizo et al. ......... 438/745

FOREIGN PATENT DOCUMENTS

JP    11-293479    10/1999

* cited by examiner

*Primary Examiner*—Shamim Ahmed
(74) *Attorney, Agent, or Firm*—Oblon, Spivak, McClelland, Maier & Neustadt, P.C.

(57) ABSTRACT

A regeneration process is disclosed for an etching solution composed of a phosphoric acid solution and used in etching silicon nitride films in an etch bath. As a result of the etching, the etching solution contains a silicon compound. According to the regeneration process, the etching solution with a silicon compound contained therein is taken out of the etch bath. Water is then added to the taken-out etching solution to lower a concentration of phosphoric acid in the etching solution to 80 to 50 wt. %. By the lowing of the concentration of phosphoric acid, the silicon compound is caused to precipitate. The thus-precipitated silicon compound is removed from the etching solution. An etching process making use of the regeneration process and an etching system suitable for use in practicing the regeneration process and etching process are also disclosed.

11 Claims, 3 Drawing Sheets

REGENERATION PROCESS OF ETCHING SOLUTION, ETCHING PROCESS, AND ETCHING SYSTEM

FIELD OF THE INVENTION

This invention relates to a regeneration process of an etching solution used in etching silicon nitride films and composed of an aqueous phosphoric acid solution (hereinafter simply called the "phosphoric acid solution"), an etching process, and an etching system. Specifically, the present invention is concerned with a technique for efficiently removing a silicon compound (i.e., the reaction product between silicon nitride and phosphoric acid) from an etching solution during and/or after etching treatment.

DESCRIPTION OF THE BACKGROUND

In etching treatment at a mass-fabrication line for various substrates, etching is continuously conducted while filtering and recirculating an etching solution to remove foreign matter such as dust in the etching solution such that the etching solution in an etch bath is maintained clean. This applies equally to the etching of silicon nitride films with an etching solution composed of a heated phosphoric acid solution, and etching is continuously conducted by filtering and recirculating the etching solution such that a silicon compound precipitated in the etching solution is filtered off along with other foreign matter to make the etching solution clean (see, for example, JP 3-20895 B).

By the above-described process, however, the silicon compound in the phosphoric acid solution cannot be captured practically even when filtered (for example, through a filter the pore size of which is 0.1 μm) subsequent to cooling the phosphoric acid solution to room temperature, to say nothing of filtering at a high temperature. In an etching operation of silicon nitride films, an etching solution, therefore, has to be replaced periodically by a fresh supply because precipitation or deposition of the silicon compound takes place, for example, in an etch bath and a circulation route of the etching solution and depending on the concentration of the silicon compound in the etching solution, the etch selectivity of silicon-nitride-containing films, such as silicon nitride film/silicon oxide film, varies. With these circumstances in view, the present assignee have already proposed, as processes for regenerating an etching solution which contains a silicon compound, a process featuring treatment of an etching solution with hydrogen fluoride (HF) (JP 3,072,876, pages 2-3, FIG. 1) and a regeneration treatment system for an etching solution, which is suitable for use in applying the process to industrial processes (JP 11-293479 A, pages 2-5, FIG. 1).

According to the above-described regeneration process and system for an etching solution, a silicon compound in the etching solution is reacted with added HF, and a silicon fluoride as a reaction product is removed together with water vapor. Because HF employed is also a substance that affects the etch selectivity of the silicon nitride films like the silicon compound, it is essential to measure with high accuracy the concentration of HF remaining in the etching solution and to confirm and control the finish point of regeneration treatment of the etching solution (for example, the HF concentration that does not affect the etching). This end-point control is performed, for example, by sampling a portion of the etching solution. However, the end-point control is cumbersome in proceeding with continuous etching, and is a cause of cost increase.

SUMMARY OF THE INVENTION

An object of the present invention is, therefore, to provide a regeneration process of an etching solution composed of a phosphoric acid solution and adapted to etch silicon nitride films, which permits extremely easy removal of a silicon compound formed in the etching solution, is more suitably applicable to industrial processes, and makes it possible to reduce the cost required for the regeneration of the etching solution. Another object of the present invention is to provide an etching method making use of the regeneration process. A further object of the present invention is to provide an etching system which is suitable for use in practicing the regeneration process and the etching process.

The above-described objects of the present invention can be achieved by the present invention to be described subsequently herein. Described specifically, the present invention, in a first aspect thereof, provides a regeneration process of an etching solution composed of a phosphoric acid solution and used in etching silicon nitride films in an etch bath. The process includes the following steps: (i) taking the etching solution out of the etch bath, said etching solution containing a silicon compound formed by the etching, and adding water to the taken-out etching solution to lower a concentration of phosphoric acid in the etching solution to 80 to 50 wt. % ("wt. %" will hereinafter be referred to simply as "%"); and (ii) removing the silicon compound, which has precipitated in the etching solution by the lowering of the concentration of phosphoric acid, from the etching solution.

In the above-described regeneration process, the removal of the silicon compound from the etching solution may be conducted preferably by filtration, and the concentration of phosphoric acid in the etching solution may be lowered preferably to 75 to 50%. Lowering of the concentration of phosphoric acid to such a level significantly promotes the precipitation of the silicon compound in the etching solution, so that the efficiency of removal of the silicon compound is improved and the silicon compound precipitated in the etching solution can be efficiently filtered off.

In the above-described regeneration process, the precipitation of the silicon compound in the etching solution can be further promoted considerably by cooling the temperature of the etching solution to 100° C. to room temperature (20° C.), preferably to 60° C. to room temperature (20° C.) upon lowering the concentration of phosphoric acid in the etching solution by adding water. As a consequence, the efficiency of removal of the silicon compound can be improved further, thereby making it possible to more efficiency filtering off the precipitated silicon compound from the etching solution.

In the above-described regeneration method, it is preferred to heat the etching solution to 140 to 180° C. subsequent to filtration. Heating of the etching solution to this temperature subsequent to filtration, for example, heating of the diluted etching solution close to about 160° C. which is suited for etching makes it possible to perform continuous etching.

After the filtration, it is preferred to concentrate the etching solution such that the concentration of phosphoric acid in the etching solution is raised to 80 to 90%. Continuous etching can be efficiently performed by raising the concentration of phosphoric acid in the diluted etching solution close to about 87% which is suited for etching.

In a second aspect of the present invention, there is also provided a process for etching silicon nitride films with an etching solution, which is composed of a phosphoric acid solution, in an etch bath. The etching process includes the following steps: (i) taking the etching solution out of the etch bath during or after the etching, the etching solution containing a silicon compound; (ii) regenerating the etching solution by the regeneration process of the present invention; and returning the thus-regenerated etching solution to the etch bath.

In a third aspect of the present invention, there is also provided a process for etching silicon nitride films with an etching solution, which is composed of a phosphoric acid solution, in an etch bath. The etching process includes the following steps: (i) taking the etching solution out of the etch bath during or after the etching, the etching solution containing a silicon compound; (ii) dividing the taken-out etching solution into two streams; (iii) filtering the etching solution (A) in one of the two streams and returning the thus-filtered etching solution to the etch bath; (iv) regenerating the etching solution (B) in the other stream by the regeneration process of the present invention; and (v) combining the regenerated etching solution (B) with the filtered etching solution (A), and returning the thus-combined etching solution to the etch bath.

The above-described etching processes of the present invention can realize, for example, continuous etching of silicon nitride films, thereby making it possible to achieve improvements in both the etching quality of etched products and the rate of etching operation.

In a fourth aspect of the present invention, there is also provided an etching system for practicing one of the above-described etching processes. The etching system includes: (i) a dilution and precipitation unit for taking the etching solution out of the etch bath, the etching solution containing the silicon compound, and diluting the taken-out etching solution with water to precipitate the silicon compound, (ii) a filtration unit for the silicon compound, and (iii) at least one of a concentration unit and heating unit for the etching solution. The dilution and precipitation unit, the filtration unit and the at least one of the concentration unit and heating unit are arranged in the order that they are presented.

According to the etching system of the present invention, the dilution and precipitation unit, the filtration unit and the at least one of the concentration unit and heating unit are arranged in the order that they are presented. Owing to this arrangement, the system can be simplified than the above-described conventional etching system which adds HF for regeneration, and can easily reduce an initial cost and control recirculation of the etching solution.

According to the etching system of the present invention, evaporation of water vapor in the concentration unit makes it possible to conduct concentration concurrently with heating. Further, arrangement of the concentration unit on an upstream or downstream side of the heating unit makes it possible to raise the concentration of phosphoric acid in the etching solution to 80 to 90%, for example, close to about 87% which is the phosphoric acid concentration suited for etching, and hence, to efficiently conduct continuous etching.

The present invention makes it possible to easily remove a silicon compound which progressively accumulates in an etching solution, which is composed of a phosphoric acid solution, upon etching silicon nitride films with the phosphoric acid solution. Compared with the above-described process featuring the addition of HF, the present invention is not bothered by the control of an end-point in regeneration treatment of the etching solution, and can simplify facilities and can also reduce the maintenance cost.

DETAILED DESCRIPTION OF THE PREFERRED EMBODIMENTS

Figure 1:
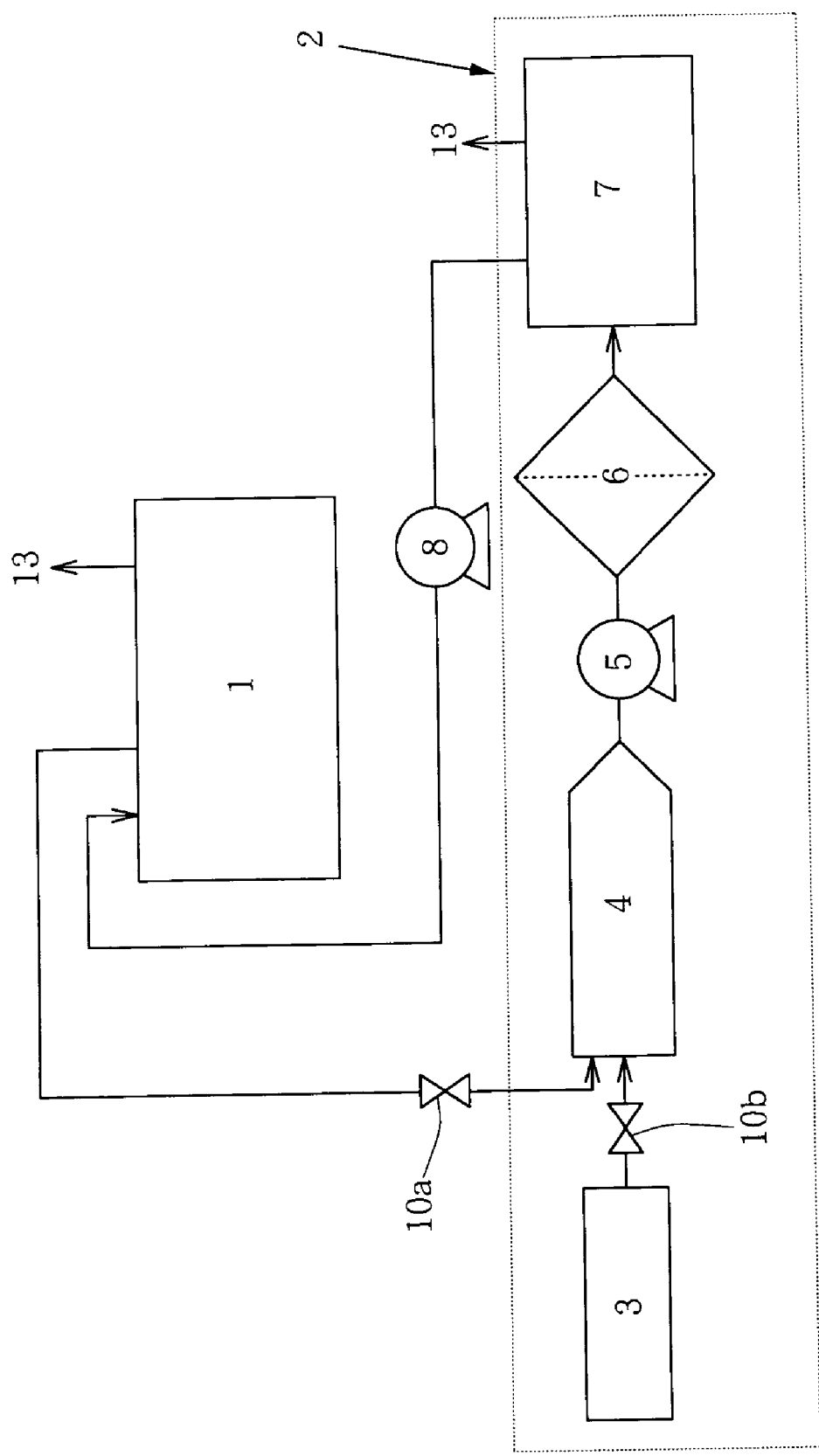
FIG. 1 is a schematic diagram of an etching system according to a first embodiment of the present invention for practicing the etching process of the present invention.

The present invention will next be described in further detail on the basis of the preferred embodiments. Conventionally, a semiconductor wafer or the like is oxidized to form a silicon oxide film as a device isolating film on a surface of the wafer. In the process for the formation of the silicon oxide film, a silicon nitride film and silicon oxide film exist as oxidization-resistant masks on the surface of the wafer, and only the silicon nitride film is selectively etched. An etching solution composed of a phosphoric acid solution the concentration of which is 85 to 90% is, therefore, used as an etching solution. When the silicon nitride film is etched with the above-described etching solution, the silicon component in the silicon nitride film is caused to dissolve into phosphoric acid to form a silicon compound. This silicon compound gradually accumulates in the etching solution. In the present invention, the silicon compound is efficiently removed from the phosphoric acid solution, in which the silicon compound is contained, to regenerate the etching solution, and the thus-regenerated etching solution is recirculated for reuse.

The concentration of the silicon compound in the etching solution increases as more semiconductor wafers each of which has a silicon nitride film are treated in an etch bath. When the etching of silicon nitride films is conducted at about 160° C. which is the boiling point of the etching solution, the saturated concentration of the resulting silicon compound in the etching solution is about 85 mg/kg in terms of Si. If the etching is continued beyond this saturated concentration, the silicon compound precipitates in the etching solution so that the above-described problems such as pipe clogging arise.

The above-described etching is intended to perform selective etching of each silicon nitride film. Concurrently with the etching of the silicon nitride film, however, the silicon oxide film is also etched slightly. The etching rate of the silicon oxide film by the above-described etching is, for example, about 2 Å (depth)/min in a fresh etching solution, and the etching rate decreases as the concentration of the silicon compound in the etching solution increases. When the content of the silicon compound in the etching solution reaches the saturated concentration of the silicon compound (about 85 mg/kg in terms of Si), the etching rate of the silicon oxide film drops to around 0 Å/min. When the etching rate of the silicon oxide film varies depending on the concentration of the silicon compound in the etching solution as mentioned above, the thickness of the silicon oxide film on the surface of the wafer also varies to affect characteristics of the resulting devices. According to the regeneration process of the present invention, however, the concentration of the silicon compound in the etching solution varies less, bringing about a merit that a variation in the thickness of the silicon oxide film is suppressed to provide the resulting devices with stable characteristics.

To stabilize an etching system and to make the quality of etched products stable and uniform in an etching operation of a semiconductor wafer provided with a silicon nitride film, the concentration of the silicon compound in the etching solution must be maintained at a value lower than the above-described saturated concentration, for example, at a value lower than 80 mg/kg in terms of Si.

In the course of a pursuit of an etching-solution-regenerating process more suited for industrial processes from the above-described recognition of the problems, the present inventors found a phenomenon as will be described next. Firstly, dilution of an etching solution, which contains a silicon compound, with water facilitates precipitation of the silicon compound. Moreover, the extent of such precipitation of the silicon compound differs considerably depending on the dilution rate of the etching solution with water. Described specifically, when an etching solution with a silicon compound contained therein was diluted 1.7-fold by weight with water, it was found that about 80% of the silicon compound contained in the undiluted etching solution would precipitate. That finding then led to the confirmation that the dilution method of an etching solution with water can be fully applied to the regeneration of an etching solution as a replacement for the conventional process in which HF is added.

Therefore, the process according to the first aspect of the present invention for the regeneration of an etching solution composed of a phosphoric acid solution includes the following steps: (i) taking the etching solution out of the etch bath, said etching solution containing a silicon compound formed by the etching, and adding water to the taken-out etching solution to lower a concentration of phosphoric acid in the etching solution to 80 to 50%; and removing the silicon compound by filtration, which has precipitated in the etching solution by the lowering of the concentration of phosphoric acid, from the etching solution.

The etching solution to be subjected to regeneration treatment in the present invention is an etching solution, which generally contains a silicon compound at a concentration of about 80 mg/kg or higher in terms of Si as a result of continuation of the etching of silicon nitride films in an etch bath and also phosphoric acid at a concentration of from 85 to 90%. Water (pure water) is added to the solution to dilute the same. Although no particular limitation is imposed on the manner of addition of water, it is preferred to conduct mixing such that the etching solution and water are combined into a homogeneous mixture (for example, to combine their flows to facilitate mixing, to use a line mixer, or to arrange an additional mixing unit only for them).

When the etching solution and water are mixed together, the silicon compound contained in the etching solution precipitates. Water is added in such an amount that the concentration of phosphoric acid is lowered to 80 to 50%, preferably to 75 to 50%. As shown in Table 1 to be described subsequently herein, a concentration higher than 80% of phosphoric acid in the diluted etching solution leads to insufficient precipitation of the silicon compound from the etching solution and fails to exhibit the capturing removal effect of the silicon compound by filtration in a subsequent step. A concentration lower than 50% of phosphoric acid in the diluted etching solution, on the other hand, requires a great deal of water for dilution although the effect of promoting the precipitation of the silicon compound is not improved in proportion to the dilution. Further, upon reusing the etching solution, evaporation of a great deal of water is needed to concentrate the etching solution, and therefore, such a low concentration lacks economy.

After water is added to the etching solution, which contains the silicon compound, to promote the precipitation of the silicon compound as described above, the etching solution is filtered to remove the precipitated silicon compound (and other foreign matter). No particular limitation is imposed on the manner of filtration of the precipitate and the like, and the precipitate can be filtered off through a filter employed in this type of etching processes, or the etching solution can be left standstill in a filtration tank or the like to allow the precipitate to settle and the supernatant can be discharged. As the construction of the filter for use in the filtration of the etching solution, the cross-flow filtration system or reverse washing system, which permits removal of materials deposited on the filter surface, can be used to reduce the frequency of a regenerating operation for the filter. The filtrate (etching solution) from which the silicon compound has been removed as described above can be fed to the etch bath for reuse, as is, after heating, and/or after concentrated as needed.

The above-described regeneration process according to the first aspect of the present invention for an etching solution can be applied in such a way that the etching solution with the silicon compound contained therein is regenerated by successively taking it out in predetermined amounts from the etch bath or the etching solution with the silicon compound contained therein is once transferred from the etch bath into a storage tank arranged exclusively for this regeneration purpose and is then regenerated by successively taking it out in predetermined amounts from the storage tank. Further, as an etching system, an etching solution taken out of an etch bath as in the etching system shown in FIG. 1 or FIG. 2 or an etching solution once taken out from an etch bath into a storage tank can be regenerated in its entirety. However, not only from the standpoint of cost but also for such a purpose as avoiding any sudden change in the composition of the etching solution in the etch bath, it is preferred to regenerate only a portion of the etching solution taken out of the etch bath as in the etching system depicted in FIG. 3.

Figure 2:
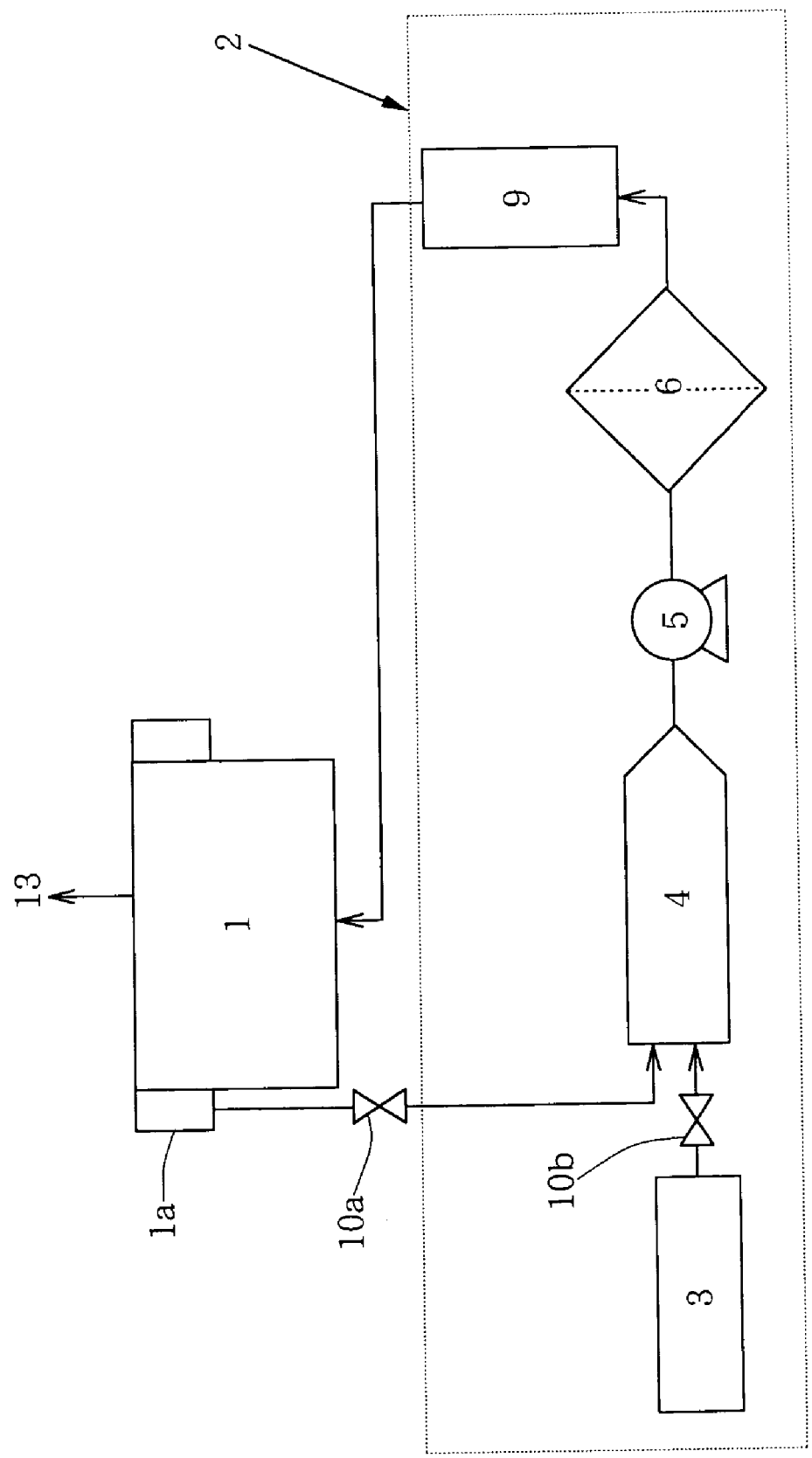
FIG. 2 is a schematic diagram of a modification of the first embodiment.
Figure 3:
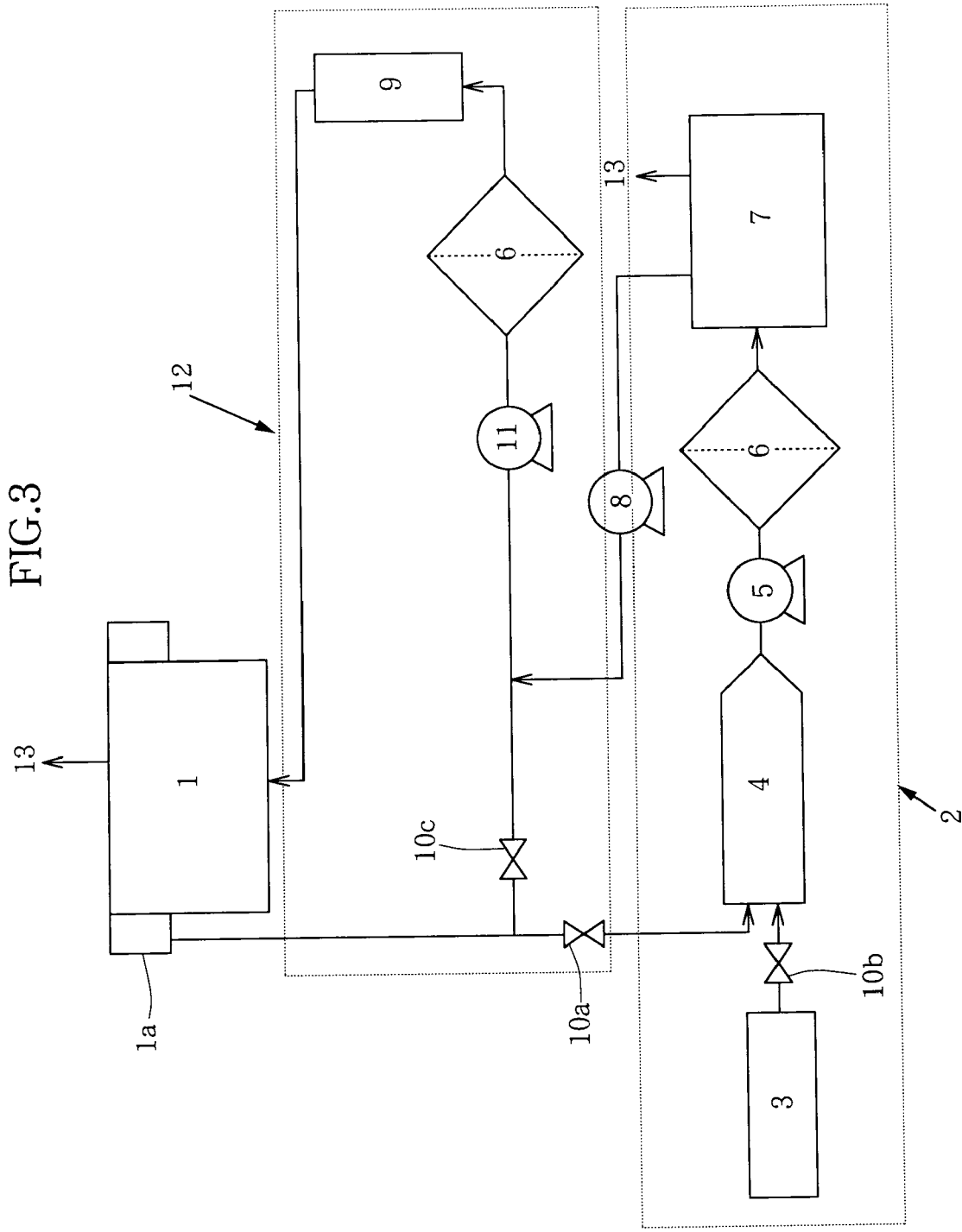
FIG. 3 is a schematic diagram of an etching system according to a second embodiment of the present invention for practicing the etching process of the present invention.

The etching processes according to the second and third aspects of the present invention and the etching system according to the fourth aspect of the present invention make use of the process according to the first aspect of the present invention for the regeneration of an etching solution. These etching processes and etching system will hereinafter be specifically described together with the regeneration process according to the first aspect of the present invention with reference to the embodiments illustrated in the drawings. FIG. 1 and FIG. 3 illustrate etching processes and systems according to the two embodiments of the present invention, and FIG. 2 shows a modification of the first embodiment of FIG. 1. These drawings schematically illustrate the etching processes and etching systems of the present invention while primarily focusing on the process of the present invention for the regeneration of the etching solution. In the following description, operatively like elements will be designated by like reference numerals, and overlapping of the description thereof will be omitted. Needless to say, the present invention is not limited at all by these embodiments.

FIRST EMBODIMENT

In the etching process and system of the present invention shown in FIG. 1, an etch bath 1 is provided with a diluting and precipitating regeneration section 2, which takes a portion of an etching solution (hereinafter called "the target etching solution"), which contains a silicon compound, from the etch bath 1 and subsequent its regeneration, returns the thus-regenerated target etching solution back to the etch bath 1. The diluting and precipitating regeneration section 2 is arranged on a piping route for recirculating the target etching solution. From a side on which the target etching solution is taken out of the etch tank 1, a water feeder 3, a dilution and precipitation unit 4, a pump 5, a filter unit 6, a concentration unit 7 and a pump are arranged in the order that they are presented. The etch bath 1 serves to conduct etching by immersing semiconductor wafers or the like having at least a silicon nitride film into the etch bath and pulling them out of the etch bath. As an alternative, the etch bath 1 can be a storage tank into which the target etching solution has been transferred from an etch bath after its use.

Although not illustrated in the drawing, the etch bath 1 is provided, as in the conventional etch baths, with a heating means and a temperature controller, a feed means for introducing a fresh supply of the etching solution, temperature sensors for detecting the temperature of the etching solution, and the like. The dilution and precipitation unit 4 is arranged on an upstream side of the filter unit 6 on the piping route for the target etching solution. The target etching solution is introduced at a predetermined flow rate from the etch bath 1 into the dilution and precipitation unit 4 via a flow regulating valve 10a or the like. At the same time, pure water is also introduced at a predetermined flow rate from the water feeder 3 into the dilution and precipitation unit 4 via a flow regulating valve 10b or the like. In the dilution and precipitation unit 4, the target etching solution is, therefore, diluted with the pure water to precipitate a portion of the silicon compound in the target etching solution. To efficiently perform the precipitation of the silicon compound, the dilution and precipitation unit 4 may preferably be provided with an illustrated cooler unit such that the target etching solution is cooled to 100° C. to room temperature (20° C.), preferably to 60° C. to room temperature (20° C.).

As a mixing means in the dilution and precipitation unit 4, a line mixer such as a static mixer may be arranged, for example. As another example, an inlet side of the dilution and precipitation unit 4, where the target etching solution and the pure water are combined, may be designed such that they can be combined into a homogeneous mixture. As a further example, an agitator may be arranged inside the dilution and precipitation unit 4.

The filter unit 6 arranged on the downstream side of the dilution and precipitation unit 4 is, for example, a filter the pore size of which is 0.1 μm as in the conventional art. In the filter unit 6, precipitates (the silicon compound and other foreign matter) contained in the target etching solution are filtered off (specifically, captured and removed) while the target etching solution diluted with the water is passing through the filter unit 6, and only the filtrate (the target etching solution from which at least a part of the silicon compound has been removed) is fed to the concentration unit 7.

The concentration unit 7 heats and concentrates the filtrate fed from the filter unit 6 such that the concentration of phosphoric acid in the filtrate is brought close to a phosphoric acid concentration suited for etching. Incidentally, the target etching solution is always boiling in the etch bath 1 so that water is evaporated to raise the concentration of phosphoric acid in the target etching solution. At the concentration unit 7, the concentration of phosphoric acid is, therefore, controlled such that as the concentration rate of the filtrate, the concentration of phosphoric acid becomes a little lower than the phosphoric acid concentration suited for etching by taking into account water vapor 13 which evaporates from the etch bath 1. The target etching solution which has been concentrated to the predetermined concentration as described above is fed into the etch bath 1 via the pump 8. The present invention may be modified, for example, such that in the system depicted in FIG. 1, a storage tank is additionally used in combination with the etch bath, the etching solution taken out of the etch bath is batchwise regenerated in its entirety and transferred into the storage tank, and the regenerated etching solution is fed from the storage tank to the etch bath whenever needed.

MODIFICATION OF FIRST EMBODIMENT

The etching process and system shown in FIG. 2 have been modified in the following points from the embodiment illustrated in FIG. 1. Specifically, an etch bath 1 serves to conduct etching by immersing semiconductor wafers or the like having at least a silicon nitride film into the etch bath and pulling them out of the etch bath, and has an overflow weir 1a arranged on an upper part of a wall of the etch bath 1. A portion of a target etching solution flows into the overflow weir 1a. The target etching solution is taken out from a bottom portion of the overflow weir 1a, and subsequent to regeneration at a diluting and precipitating regeneration unit 2, the thus-regenerated target etching solution is again introduced into the etch bath 1 through a bottom portion thereof.

The diluting and precipitating regeneration unit 2 is equipped with a heater unit 9 in place of the concentration unit 7. In this construction, to efficiently conduct the precipitation of the silicon compound in the dilution and precipitation unit 4, the target etching solution is preferably cooled to 100° C. to room temperature (20° C.), preferably to 60° C. to room temperature (20° C.) by an unillustrated cooler unit. At the heater unit 9, the temperature of the diluted and cooled target etching solution can, therefore, be raised close to about 160° C.(preferably 140-180° C.) which is the temperature suited to etching, thereby making it possible to conduct continuous etching.

SECOND EMBODIMENT

The etching process and system depicted in FIG. 3 is a schematic of the construction of an etching system employed in Example 3 to be described subsequently herein. Different from the above-described first embodiment and modification thereof, a filtration and recirculation route section 12 is arranged in combination with the diluting and precipitating regeneration unit 2 for a target etching solution.

The filtration and recirculation route section 12 itself is basically of the same construction as in the conventional art, and a pure water feeder for replenishing the water vapor 13 evaporating from the above-described etch bath 1 is omitted. Described specifically, the filtration and recirculation route section 12 is arranged on a recirculating piping route, and is provided with a pump 11, a filter unit 6 and a heater unit 9 arranged in this order from a side at which the target etching solution is taken out from the overflow weir 1a of the etch bath 1. A divided stream of the target etching solution is introduced into the filtration and recirculation route section 12, in which subsequent to removal of insoluble matter such as foreign matter at the filter unit 6, the divided stream of the target etching solution is heated and recirculated to the etch bath 1.

On the other hand, the diluting and precipitating regeneration unit 2 is arranged on the piping route for the target etching solution, and from a side at which the diluting and precipitating regeneration unit 2 is divided from the piping extending to the above-described filtration and recirculation route section 12, the diluting and precipitating regeneration unit 2 is provided with the dilution and precipitation unit 4, the pump 4, the filter unit 6, the concentration unit 7 and the pump 8 in this order. Of the etching solution taken out of the etch bath 1, a portion of the target etching solution, said portion being divided from the side of the filtration and recirculation route section 12, is regenerated as illustrated in FIG. 1 and FIG. 2, introduced back into the filtration and recirculation route section 12, and then returned together with the target etching solution, which is flowing through the filtration and recirculation route section 12, back to the etch bath 1.

The above-described dividing system of the target etching solution has the construction that to an intermediate portion of the piping connecting the overflow weir 1a with the dilution and precipitation unit 4, the piping unit on the side of the filtration and recirculation route section 12 is connected. Via a flow regulating valve 10a arranged on the piping connecting the overflow weir 1a and the dilution and precipitation unit 4 with each other and a flow regulating valve 10c arranged on the branched piping on the side of the filtration and recirculation route section 12, the etching solution can be divided at a predetermined distribution ratio. It is, however, to be noted that the system for dividing the target etching solution to the diluting and precipitating regeneration section 2 and the filtration and recirculation route section 12 can be other than the above-mentioned one.

In the above-described embodiment, the target etching solution which has been concentrated to a predetermined concentration is introduced via the pump 8 into the filtration and recirculation route section 12 on a side upstream of the pump 11. Insofar as the target etching solution is introduced into the filtration and recirculation route section 12, the introduction may be made on a side upstream of the heater unit 9 or the filter unit 6. In the present invention, the etching system depicted in FIG. 3 may also be modified such that a storage tank is additionally used in combination with the etch bath 1, the etching solution taken out of the etch bath is batchwise regenerated in its entirety and transferred into the storage tank, and the regenerated etching solution is fed from the storage tank either directly or through the filtration and recirculation route section 12 to the etch bath 1 whenever needed.

<Operation>

The etching processes and systems described above are common in that water (pure water) is added to and mixed with the target etching solution, which has been taken out of the etch bath 1, in the diluting and precipitating regeneration section 2 to lower the concentration of phosphoric acid in the diluted etching solution to 80 to 50% (preferably 75 to 50%), the resulting mixture is filtered, and subsequent to concentration as needed, the filtrate is then returned to the etch bath 1. In each of the embodiment shown in FIG. 1 and the modification illustrated in FIG. 2, a predetermined amount of water (pure water) is added to and mixed with the whole target etching solution, which has been taken out of the etch bath 1, in the dilution and precipitation unit 4 so that the target etching solution is diluted in its entirety. As a result, the precipitation of the silicon compound in the target etching solution is promoted, and then, the target etching solution is caused to pass through the filter unit 6 to capture and remove the precipitated silicon compound (and other foreign matter). Accordingly, the diluting and precipitating regeneration unit 2 can substitute for the conventional filtration and recirculation route section.

On the other hand, the embodiment illustrated in FIG. 3 is of the system that in the filtration and recirculation route section 12, the filtration of the target etching solution is always continued to recirculate the target etching solution. The embodiment of FIG. 3 is suitable, for example, for etching treatment in which the degree of etching (etching volume) per unit time is large. Assuming, for example, etching of semiconductor wafers each of which has a diameter of 300 mm and at least a silicon nitride film, a target etching solution overflowed from the etch bath 1 is introduced at a flow rate of 1.5 kg/min from the overflow weir 1a into the dilution and precipitation unit 4 and also, at a flow rate of 12.05 kg/min into the filtration and recirculation route section 12.

When in the dilution and precipitation unit 4, pure water is fed a flow rate of 250 mL/min from the water feeder 3 and is added to and mixed with the target etching solution, the saturated concentration of the silicon compound in the target etching solution is lowered so that the silicon compound precipitate in the target etching solution. It is preferred to arrange an unillustrated cooler unit in the dilution and precipitation unit 4 and to cool the target etching solution to 100° C. to room temperature (20° C.), preferably to 60° C. to room temperature (20° C.). This cooling makes it possible to further improve the efficiency of precipitation of the silicon compound. The target etching solution is fed together with the precipitate to the filter unit 6, and the filtrate is captured by the filter in the filter unit 6.

As the filtrate passed through the filter has been diluted with a great deal of pure water, feeding of the filtrate, as is, to the filtration and recirculation route section 12 or the etch bath 1 gives deleterious effects to the control of the temperature and concentration in the etch bath 1. To avoid such an inconvenience, the second embodiment concentrates the filtrate (target etching solution), which has passed through the filter, to around the concentration of phosphoric acid in the target etching solution as taken out of the etch bath 1. Here, depending on the concentration rate, pure water may be injected into the thus-concentrated target etching solution to control the temperature and concentration of the target etching solution, or the filtrate is concentrated to a concentration at which water required for the above-described temperature and concentration control still remains. The latter can obviate injection of pure water. Because the concentration method of the target etching solution should be determined depending on the boiling point, specific gravity and phosphoric acid concentration of the target etching solution, a method chosen based on such parameters is used. For example, the etching solution can be concentrated by keeping it boiling at a constant temperature. As an alternative, an appropriate back pressure can be chosen for purging nitrogen gas to control the concentration of phosphoric acid in the target etching solution to a desired level. These apply equally to the concentration unit 7 in the system depicted in FIG. 1.

In the above-described continuous etching operation and continuous regeneration operation of the etching solution, the captured precipitate gradually accumulates in each filter unit 6. To continuously regenerate the target etching solution, plural filter units may be arranged in parallel with each other, for example, between the pump 5 and the concentration unit 7 or between the pump 5 and the heater unit 9, and the filter units can be changed over from one reached to a limit to the next one to permit a continuous operation.

The target etching solution is carried away, for example, as a result of its adherence to wafers immersed into and pulled out of the etch bath 1. The target etching solution is, therefore, progressively reduced in volume as more wafers are treated so that a fresh supply of the etching solution has to be replenished. This fresh supply of the etching solution can be fed to any one of the etch bath 1, the overflow weir 1a, the diluting and precipitating regeneration section 2 and the filtration and recirculation route section 12. Preferably, the etch bath 1 or the concentration unit 7 is suitable in the embodiment of FIG. 1, the etch bath 1 or the overflow weir 1a is adequate in the modification of FIG. 2, and the etch bath 1, the overflow weir 1a or the concentration unit 7 is appropriate in the embodiment of FIG. 3. Any one of these feeding locations allow to feed the fresh supply of the etching solution under atmospheric pressure, there is no potential problem of a reverse flow of the fresh supply of the etching solution toward a side from which it is fed. In addition to this advantage, feeding to the concentration unit 7 can also prevent any sudden temperature drop in the etch bath 1. On a mass fabrication line, it may be contemplated as a detailed construction to feed the target etching solution to the dilution and precipitation unit 4 subsequent to its cooling or to feed the etching solution from the dilution and precipitation unit 4 into a storage tank for leaving it standstill there and then to feed it from the storage tank to the filter unit 6. Such a detailed construction may be added to the present invention.

EXAMPLES

A description will hereinafter be made of a test (Example 1) in which the saturated concentration of the silicon compound was investigated relative to the concentration (70 to 85%) of phosphoric acid in an etching solution (phosphoric acid solution) and another test (Example 2) on the efficiency of removal of the silicon compound versus the cooled temperature of a phosphoric acid solution. A further description will also be made about a further test (Example 3) in which an etching solution in an etch bath was regenerated as a whole and a still further test (Example 4) in which an etching solution was regenerated using a system similar to that illustrated in FIG. 3. Incidentally, each concentration of the silicon compound will be expressed in terms of Si. The measurement of each concentration of the silicon compound was conducted by an atomic-absorption flame spectrophotometer (atomic absorption).

Example 1

This test is one example of tests in which a phosphoric acid solution was diluted with water to predetermined various concentrations to determine any variations in the concentrations of the silicon compound in the diluted phosphoric acid solutions before and after filtration. The phosphoric acid solution provided for those tests was a phosphoric acid solution which had been used in etching silicon nitride films, had a phosphoric acid concentration of 89% and contained the silicon compound dissolved at 63 mg/kg (hereinafter called "the spent phosphoric acid"). Predetermined amounts of the spent phosphoric acid were placed in flasks, respectively, and were then diluted with distilled water to give phosphoric acid concentrations of 85% (comparative example), 80%, 75% and 70%. The thus-diluted phosphoric acid solutions were thereafter cooled to 20° C. (the amounts of the phosphoric acid solutions of the respective concentrations were set at 100 g or greater). After the phosphoric acid solutions of the respective concentrations were stirred under the same conditions in the flasks, 50-g aliquots of the individual phosphoric acid solutions were separately filtered through filters having a filter pore size of 0.1 μm, and the filtrates were provided as post-filtration phosphoric acid solutions. On the other hand, the phosphoric acid solutions remaining without filtration were provided as pre-filtration phosphoric acid solutions. With respect to those pre-filtration phosphoric acid solutions and post-filtration phosphoric acid solutions, the concentrations of the phosphoric acid in the phosphoric acid solutions were measured by atomic absorption. Table 1 shows the measurement date of the concentrations of the silicon compound before and after the filtration.

TABLE 1

| | | | | |
|---|---|---|---|---|
| Concentration of phosphoric acid in phosphoric acid solution (unit: wt. %) | 85% | 80% | 75% | 70% |
| Concentration of silicon compound before filtration (in terms of Si) (unit: ppm) | 60.1 | 56.5 | 53.0 | 49.5 |
| Concentration of silicon compound after filtration (in terms of Si) (unit: ppm) | 50.6 | 29.0 | 12.4 | 2.9 |

From the above test, it is understood that the precipitation of the silicon compound contained in a phosphoric acid solution is promoted as the concentration of phosphoric acid in the phosphoric acid solution is lowered by dilution with water and hence, the concentration of the silicon compound differs substantially between before and after filtration. Especially when the phosphoric acid solution was diluted to 75% or lower, the precipitation of the silicon compound was pronouncedly promoted so that as a result of the filtration, the concentration of the silicon compound was lowered from 53.0 ppm to 12.4 ppm at 75% dilution and from 49.5 ppm to 2.9 ppm at 70% dilution, and the silicon compound was effectively removed from the phosphoric acid solution. The present invention has been completed by paying attention to such a change in the saturated concentration of the silicon compound depending on a difference in the concentration of phosphoric acid.

Example 2

The efficiency of removal of the silicon compound depending on variations in the cooled temperature of the spent phosphoric acid was next tested. After four samples of the spent phosphoric acid (676.3 g) were cooled to the temperatures shown in Table 2, respectively, pure water (164.38 g per sample) was added to the respective samples to give a total volume of 840.68 g each, that is, to lower the concentration of phosphoric acid in the spent phosphoric acid to 70%. The resulting mixtures were separately stirred, followed by immediate filtration. As a result, as shown in Table 2, the efficiency of removal of the silicon compound was improved as the cooled temperature of the spent phosphoric acid was lowered. Incidentally, the data of the concentrations of the silicon compound in the water-diluted, spent phosphoric acid samples after filtration were lowered to a similar level as in Example 1 (phosphoric acid concentration: 70%) when the diluted, spent phosphoric acid samples were filtered after left over for a predetermined time.

TABLE 2

Efficiency of removal of the silicon compound depending on variations in cooled temperature

| Conditions | Concentration of silicon compound in spent phosphoric acid (in terms of Si) (ppm) |
|---|---|
| Before filtration | 52.0590293 |
| 65° C. cooling + filtration | 41.51267604 |
| 50° C. cooling + filtration | 22.33050712 |
| Room temp. (50° C.) cooling + filtration | 10.76796842 |

Example 3

This test is one example of tests in which were conducted assuming, for example, such etching treatment as regenerating a phosphoric acid solution, which had been used in an etch bath for a mass fabrication line and contained the silicon compound, as a whole, in other words, as regenerating the phosphoric acid solution batchwise. In the test, an 87% phosphoric acid solution (30 kg) with 71 mg/kg of the silicon compound contained therein was placed in a first test bath. Pure water (21 kg) was added to the first test bath. The phosphoric acid solution and the pure water were agitated into a homogeneous solution, and at the same time, were cooled to 25° C. As a result, the concentration of phosphoric acid was adjusted to 51%. Subsequent to the adjustment, the phosphoric acid solution was transferred from the first test bath into a second test bath through a filter-equipped piping and a pump. In the course of the transfer, any precipitate of the silicon compound was thus filtered off. Further, the filtrate in the second test bath was concentrated by a concentration unit to raise its phosphoric acid concentration to the initial phosphoric acid concentration of 87%. The content of the silicon compound contained in the thus-concentrated phosphoric acid solution was then measured. As a result, its content was found to be 14 mg/kg. This value is equivalent to about 80% in terms of the removal rate of silicon, and indicates that from the practical view point, the regeneration process of the present invention is also sufficiently effective as a regeneration process for removing the silicon compound.

Example 4

This test is one examples of tests in which an etching solution was regenerated by a system similar to that illustrated in FIG. 3. A comparison was made between operation of the filtration and recirculation route section 12 and the diluting and precipitating regeneration unit 2 in the drawing (invention example) and operation of only the filtration and recirculation route section 12 (comparative example). In the test, an etching solution (concentration of phosphoric acid: 87%, concentration of silicon compound: 85 mg/kg) in the etch bath 1 was caused to flow out at a flow rate of 13.55 kg/min from the etch bath 1. In the invention example, the etching solution was divided at a flow rate of 12.05 kg/min into the filtration and recirculation route section 12 and at a flow rate of 1.5 kg/min into the diluting and precipitating regeneration section 2. The etching solution introduced into the diluting and precipitating regeneration section 2 was fed to the dilution and precipitation unit 4, where pure water was added at a flow rate of 0.25 kg/min such that the etching solution and the pure water were mixed into a homogeneous solution and at the same time, were cooled to 60° C. to precipitate the silicon compound.

Subsequently, the precipitate of the silicon compound was removed by the filter in the filtration unit 6, and the filtrate (concentration of phosphoric acid: 74.6%, concentration of silicon compound: 38 mg/kg) was fed to a tank in the concentration unit 7. At the concentration unit 7, the filtrate was boiled under control to drive off water (0.2 kg/min) so that the concentration of phosphoric acid was raised to 84%. The thus-concentrated filtrate was then fed to the filtration and recirculation route section 12, and was combined with the phosphoric acid solution flowing through the filtration and recirculation route section 12. The thus-combined phosphoric acid solution was fed through the filter of the filter unit 6 in the route section 12 and then through the heater unit 9 such that it was heated to 160° C. Subsequently, the phosphoric acid solution was recirculated and fed back to the etch bath 1.

In the comparative example, on the other hand, the etching solution flowed out of the etch bath 1 was fed in its entirety to the filtration and recirculation route section 12 and, after insoluble matter was removed by the filter of the filtration unit 6 in the route section 12, the filtrate was heated at the heater unit 9 and then recirculated and fed back to the etch bath 1. In this test, the etching solution in the etch bath 1 was sampled after a predetermined time to determine the concentration of the silicon compound. As a result, the concentration of the silicon compound was found to be about 70 mg/kg in the invention example, but was found to be the same as the initial concentration, that is, 85 mg/kg in the comparative example. From a comparison between these data, it is also appreciated that compared with the conventional regeneration and etching processes and etching system provided with the filtration and recirculation route section 12, the regeneration and etching processes and etching system of the present invention can prolong the life of an etching solution and can also maintain the concentration of the silicon compound at a sufficiently low level in the etching solution under use although the present invention requires a system which is simpler in construction and easier in maintenance.

Etched products which can be fabricated by applying the etching process and system according to the present invention include those to be described subsequently herein. By the etching process and system according to the present invention, all of them can be uniformly etched at low cost and with superb efficiency. Upon conducting such etching, use of the regeneration process of the present invention for the etching solution makes it possible to repeatedly use the same etching solution over an extended period.

Described specifically, a step in which a pattern of a silicon nitride film is formed on each silicon wafer and using this silicon nitride film as an oxidation resistant mask, the silicon wafer is selectively oxidized to form a silicon oxide film, in other words, a so-called LOCOS (Local Oxidation of Silicon) is widely employed in the processing of wafers in the fabrication of semiconductor devices. In this LOCOS step, removal of the above-described mask formed of the silicon nitride film, which has become no longer needed, is effected by conducting etching treatment with a phosphoric acid solution having high etch selectivity to the silicon nitride film and silicon oxide film. Recently, trench isolation has been put into practical use as a device isolation technique capable of breaking a limit imposed on the miniaturization of LOCOS isolation, and has already become a main stream of device isolation technology. In LSIs fabricated using a 0.2 μm or finer design rule, the depths of trenches are from 200 to 400 nm, i.e., are relative shallow in general, so that the isolation technique applied to such LSIs is called shallow trench isolation (STI). In this technique, a phosphoric acid solution is also used as an etching solution for the removal of silicon nitride films after they become no longer needed.

This application claims the priority of Japanese Patent Application 2002-269405 filed Sep. 17, 2002, which is incorporated herein by reference.

The invention claimed is:

1. A regeneration process of an etching solution composed of a phosphoric acid solution and used in etching silicon nitride films in an etch bath, which comprises the following steps:

taking said etching solution out of said etch bath, said etching solution containing a silicon compound formed by said etching, and adding water to said taken-out etching solution to lower a concentration of phosphoric acid in said etching solution to 80 to 50 wt. %; and removing said silicon compound, which has precipitated in said etching solution by said lowering of said concentration of phosphoric acid, from said etching solution, wherein subsequent to said removal of said silicon compound from said etching solution, said concentration of phosphoric acid in said etching solution is raised to 80 to 90 wt. %.

2. The regeneration process according to claim 1, wherein said removal of said silicon compound from said etching solution is conducted by filtration.

3. The regeneration process according to claim 1, wherein said concentration of phosphoric acid in said etching solution is lowered to 75 to 50 wt. %.

4. The regeneration process according to claim 1, wherein upon diluting said etching solution, said etching solution is cooled to 100° C. to room temperature.

5. The regeneration process according to claim 1, wherein subsequent to said removal of said silicon compound from said etching solution, said etching solution is heated to 140° C. to 180° C.

6. A process for etching silicon nitride films with an etching solution, which is composed of a phosphoric acid solution, in an etch bath, which comprises the following steps:

taking said etching solution out of said etch bath during or after said etching, said etching solution containing a silicon compound;

regenerating said etching solution by a process according to any one of claims 1-5; and returning said thus-regenerated etching solution to said etch bath.

7. A process for etching silicon nitride films with an etching solution, which is composed of a phosphoric acid solution, in an etch bath, which comprises the following steps:

taking said etching solution out of said etch bath during or after said etching, said etching solution containing a silicon compound;

dividing the taken-out etching solution into two streams;

filtering said etching solution (A) in one of said two streams and returning the thus-filtered etching solution to said etch bath;

regenerating said etching solution (B) in the other stream by a process according to any one of claims 1-5; and combining said regenerated etching solution (B) with said filtered etching solution (A), and returning said thus-combined etching solution to said etch bath.

8. The regeneration process according to claim 1, wherein said concentration of phosphoric acid in said etching solution is lowered to 80 to 70 wt. %.

9. The regeneration process according to claim 1, wherein said concentration of said silicon compound after removal from said etching solution is less than 30 ppm.

10. The regeneration process according to claim 1, wherein said concentration of said silicon compound after removal from said etching solution is less than 15 ppm.

11. The regeneration process according to claim 1, wherein said concentration of said silicon compound after removal from said etching solution is less than 3 ppm.

* * * * *